(12) United States Patent
Wang et al.

(10) Patent No.: US 10,964,760 B2
(45) Date of Patent: Mar. 30, 2021

(54) ELECTROLUMINESCENT DISPLAY PANEL WITH ANTI-ULTRAVIOLET LIGHT MATERIAL, METHOD FOR MANUFACTURING THE SAME, AND DISPLAY APPARATUS

(71) Applicant: BOE TECHNOLOGY GROUP CO., LTD., Beijing (CN)

(72) Inventors: Qing Wang, Beijing (CN); Shengji Yang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/551,682

(22) Filed: Aug. 26, 2019

(65) Prior Publication Data

US 2020/0273915 A1 Aug. 27, 2020

(30) Foreign Application Priority Data

Feb. 26, 2019 (CN) .......................... 201910140840.0

(51) Int. Cl.
*H01L 27/32* (2006.01)
*H01L 51/56* (2006.01)
*H01L 51/52* (2006.01)

(52) U.S. Cl.
CPC ........ *H01L 27/322* (2013.01); *H01L 27/3244* (2013.01); *H01L 51/5253* (2013.01); *H01L 51/56* (2013.01); *H01L 2227/323* (2013.01)

(58) Field of Classification Search
CPC ....... H01L 33/00–648; H01L 27/14621; H01L 27/322
See application file for complete search history.

(56) References Cited

U.S. PATENT DOCUMENTS

| 2016/0343906 A1* | 11/2016 | Namerikawa | H01L 33/42 |
| 2016/0343970 A1* | 11/2016 | Tazaki | B32B 7/04 |
| 2017/0250357 A1* | 8/2017 | Sakai | H01L 51/003 |

\* cited by examiner

*Primary Examiner* — Suberr L Chi
(74) *Attorney, Agent, or Firm* — Kinney & Lange, P.A.

(57) ABSTRACT

An electroluminescent display panel, a method for manufacturing the same and a display apparatus are disclosed. The electroluminescent display panel includes: a silicon backplate; a light emitting device on the silicon backplate; a first sealing layer on a side of the light emitting device away from the silicon backplate; an adhesive layer on a side of the first sealing layer away from the light emitting device; and a color filter layer on a side of the adhesive layer away from the first sealing layer. The light emitting device includes a luminescent material, and the first sealing layer includes an anti-ultraviolet light material for preventing ultraviolet light from irradiating onto the luminescent material.

10 Claims, 5 Drawing Sheets

ELECTROLUMINESCENT DISPLAY PANEL WITH ANTI-ULTRAVIOLET LIGHT MATERIAL, METHOD FOR MANUFACTURING THE SAME, AND DISPLAY APPARATUS

CROSS-REFERENCE TO RELATED APPLICATION

This application claims the benefit of Chinese Patent Application No. 201910140840.0 filed on Feb. 26, 2019 in the National Intellectual Property Administration of China, the whole disclosure of which is incorporated herein by reference.

TECHNICAL FIELD

The present disclosure relates to the field of display technologies, and in particular, to an electroluminescent display panel, a method for manufacturing an electroluminescent display panel, and a display apparatus.

BACKGROUND

An organic light emitting diode (abbreviated as OLED) display on silicon is a micro-display that has been developed in recent years. For example, such a micro-display has been gradually applied to virtual reality (abbreviated as VR) or augmented reality (abbreviated as AR). In the OLED display on silicon, a driving circuit is fabricated in a single crystal silicon wafer using a mature CMOS process, and an OLED device is fabricated on the single crystal silicon wafer. Thereby, an OLED display with high display density and high refresh rate may be manufactured by using a mature process for manufacturing a semiconductor on silicon.

In an existing OLED display on silicon, white OLEDs and a color filter layer are usually used to achieve colorization. Therefore, it has become an important issue for researchers how to design structures, such as OLED devices, color filter layer and the like, in the OLED display on silicon, in order to achieve a micro-display with excellent performance.

SUMMARY

In an aspect, an electroluminescent display panel is provided, comprising: a silicon backplate; a light emitting device on the silicon backplate; a first sealing layer on a side of the light emitting device away from the silicon backplate; an adhesive layer on a side of the first sealing layer away from the light emitting device; and a color filter layer on a side of the adhesive layer away from the first sealing layer, wherein the light emitting device comprises a luminescent material, and the first sealing layer comprises an anti-ultraviolet light material for preventing ultraviolet light from irradiating onto the luminescent material.

For example, the anti-ultraviolet light material comprises an ultraviolet light converting material for converting the ultraviolet light into visible light.

For example, the anti-ultraviolet light material comprises an ultraviolet light filtering material for causing the ultraviolet light to be cut off and allowing visible light to pass through.

For example, the first sealing layer comprises: at least one light converting layer, the at least one light converting layer comprising the ultraviolet light converting material; and an encapsulating layer, wherein the at least one light converting layer is disposed on a side of the encapsulating layer proximate to the adhesive layer; and/or disposed on a side of the encapsulating layer away from the adhesive layer.

For example, the first sealing layer comprises: at least one light converting layer, the at least one light converting layer comprising the ultraviolet light converting material; and an encapsulating layer comprising at least one organic encapsulating layer and at least one inorganic encapsulating layer, the at least one organic encapsulating layer and the at least one inorganic encapsulating layer being alternately disposed such that the encapsulating layer has a laminated structure, wherein the at least one light converting layer is disposed between any adjacent ones of the at least one organic encapsulating layer and the at least one inorganic encapsulating layer.

For example, the first sealing layer comprises only an encapsulating layer, the encapsulating layer comprises at least one organic encapsulating layer and at least one inorganic encapsulating layer, the at least one organic encapsulating layer and the at least one inorganic encapsulating layer being alternately disposed such that the encapsulating layer has a laminated structure, and the at least one organic encapsulating layer comprises an organic encapsulating material and the ultraviolet light converting material.

For example, the ultraviolet light converting material comprises: europium-4,7-phenyl-1,10-phenanthroline complex.

For example, the ultraviolet light converting material comprises: europium-4,7-phenyl-1,10-phenanthroline complex, and a weight percentage of the europium-4,7-phenyl-1,10-phenanthroline complex in the light converting layer is proportional to a thickness of the light converting layer.

For example, the first sealing layer comprises: at least one light filtering layer, the at least one light filtering layer comprising the ultraviolet light filtering material; and an encapsulating layer, the at least one light filtering layer is disposed on a side of the encapsulating layer proximate to the adhesive layer; and/or disposed on a side of the encapsulating layer away from the adhesive layer.

For example, the first sealing layer comprises: at least one light filtering layer, the at least one light filtering layer comprising the ultraviolet light filtering material; and an encapsulating layer comprising at least one organic encapsulating layer and at least one inorganic encapsulating layer, the at least one organic encapsulating layer and the at least one inorganic encapsulating layer being alternately disposed such that the encapsulating layer has a laminated structure, wherein the at least one light filtering layer is disposed between any adjacent ones of the at least one organic encapsulating layer and the at least one inorganic encapsulating layer.

For example, the first sealing layer comprises only an encapsulating layer, the encapsulating layer comprising at least one organic encapsulating layer and at least one inorganic encapsulating layer, the organic encapsulating layer and the inorganic encapsulating layer being alternately disposed such that the encapsulating layer has a laminated structure, and wherein the at least one inorganic encapsulating layer comprises an inorganic encapsulating material and the ultraviolet light filtering material.

For example, the ultraviolet light filtering material comprises cerium oxide or titanium oxide.

For example, the light filtering layer comprises at least one first light filtering sub-layer and at least one second light filtering sub-layer, the first light filtering sub-layer and the second light filtering sub-layer being alternately disposed such that the light filtering layer has a laminated structure, and wherein the ultraviolet light filtering material of the first light filtering sub-layer comprises one of cerium oxide or titanium oxide, and the ultraviolet light filtering material of the second light filtering sub-layer comprises the other one of cerium oxide or titanium oxide.

For example, an orthographic projection of the first sealing layer on the silicon backplate covers an orthographic projection of the light emitting device on the silicon backplate.

For example, the adhesive layer comprises an adhesive that is curable under an irradiation of the ultraviolet light.

For example, the display panel further comprises a second sealing layer on a side of the color filter layer away from the adhesive layer, wherein the second sealing layer comprises an inorganic encapsulating material.

In another aspect, a display apparatus comprising the electroluminescent display panel as mentioned above is provided.

In a further aspect, a method for manufacturing an electroluminescent display panel is provided, comprising: forming a light emitting device on a silicon backplate; forming a first sealing layer on a side of the light emitting device away from the silicon backplate; forming an adhesive layer on a side of the first sealing layer away from the light emitting device; and forming a color filter layer on a side of the adhesive layer away from the first sealing layer, wherein the light emitting device comprises a luminescent material, and the first sealing layer comprises an anti-ultraviolet light material for preventing ultraviolet light from irradiating onto the luminescent material.

For example, the anti-ultraviolet light material comprises an ultraviolet light converting material for converting the ultraviolet light into visible light; or the anti-ultraviolet light material comprises an ultraviolet light filtering material for causing the ultraviolet light to be cut off and allowing visible light to pass through.

For example, the method further comprises: preparing the ultraviolet light converting material, wherein the preparing the ultraviolet light converting material comprises: dissolving 4,7-diphenyl-1,10-phenanthroline and europium nitrate hexahydrate in ethanol; forming a precipitate through uniform stir; rinsing the precipitate with absolute ethanol, and drying the precipitate; and dispersing the dried precipitate in a PVP ethanol solution, wherein a weight percentage of the precipitate in the PVP ethanol solution is in a range of 0.5% to 1.5%.

BRIEF DESCRIPTION OF THE DRAWINGS

Accompanying drawings are only for the purpose of illustrating optional embodiments of the present disclosure and are not to be construed as limiting the embodiments of the present disclosure. Throughout the drawings, the same or similar components are denoted by the same reference numerals. In the drawings.

DETAILED DESCRIPTION OF EMBODIMENTS

Figure 1:
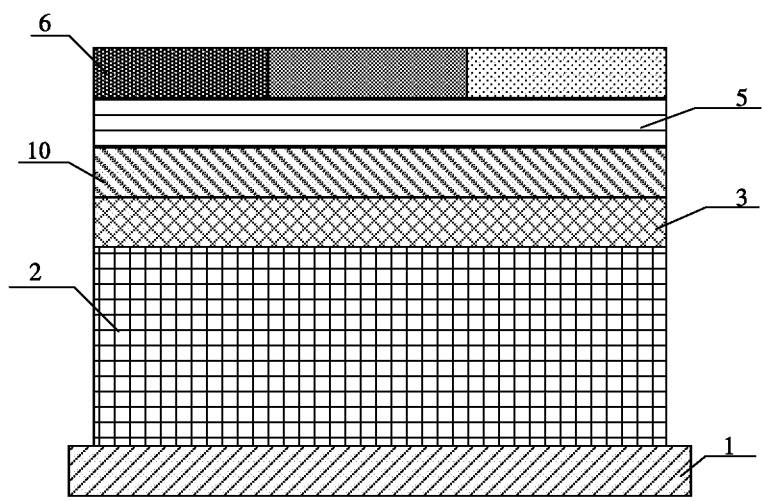
FIG. 1 is a schematic structural view of an electroluminescent display panel on silicon according to some embodiments of the present disclosure.

In order to make objectives, technical solutions and advantages of embodiments of the present disclosure more clear, the technical solutions of the embodiments of the present disclosure will be clearly and completely described below in conjunction with accompanying drawings of the embodiments of the present disclosure. It is apparent that the described embodiments are part of the embodiments of the present disclosure, but not all of the embodiments. All other embodiments which may be obtained by those skilled in the art based on the described embodiments of the present disclosure without any creative work shall fall within the scope of the disclosure.

Unless otherwise defined, technical or scientific terms used in the present disclosure shall be of ordinary meaning as understood by those skilled in the art. The words such as "first", "second" or the like used in the present disclosure do not denote any order, quantity, or importance, but are used to distinguish different components. The words such as "including", "includes", "comprising" or "comprises" or the like means that an element or item preceding such the words includes elements or items following such the words, equivalents thereof, but does not exclude other elements or items.

Herein, unless otherwise specified, directional terms such as "up", "low", "left", "right", "in", "out" or the like, are used to indicate an orientation or a position based on the drawings. Such the directional terms are merely for the convenience of describing the disclosure, but are not intended to indicate or imply that devices, elements or components are necessarily configured or operated at the specific orientations or positions. It should be understood that when absolute positions of described objects are changed, relative positional relationships of the objects indicated by the terms may also be changed accordingly. Therefore, these directional terms are not to be construed as limiting the disclosure.

Herein, unless otherwise specified, expressions such as "anti-ultraviolet light material" and "anti-ultraviolet light layer" are intended to mean that the material or the layer may cause the ultraviolet light to be cut off, that is, the material or the layer may block the ultraviolet light from passing therethrough; the expressions are also intended to mean that the material or the layer may convert the ultraviolet light into light in other wavelength bands, for example, convert the ultraviolet light into visible light. Correspondingly, expressions such as "(ultraviolet) light filtering material" and "(ultraviolet) light filtering layer" are intended to mean that the material or the layer may cause the ultraviolet light to be cut off, that is, the material or the layer may block the ultraviolet light from passing therethrough. Expressions such as (ultraviolet) light converting material" and "(ultraviolet) light converting layer" are intended to mean that the material or the layer may convert ultraviolet light into light in other wavelength bands, for example, convert ultraviolet light into visible light.

In the related art, OLEDs of three primary colors or a white OLED together with a color filter layer may be provided in an OLED display in order to achieve colorization. In a manner of providing the OLEDs of three primary colors, it is needed to separately vapor-deposit luminescent materials of three primary colors. The OLED display on silicon may have high pixel densities, and an existing vapor-deposition process is difficult to meet vapor-deposition requirements of the OLED display on silicon with high PPI. Therefore, the OLED display on silicon may typically employ the white OLED together with the color filter layer to achieve colorization.

In a color filter process for preparing the color filter layer, steps and parameters of the color filter process are particularly important. A resolution of the OLED display on silicon is directly dependent on fineness of the color filter process. With the development of technology, a low-temperature color filter technology is applied in the color filter process for preparing the color filter layer of the OLED display on silicon, so that a pixel processing precision in a range of 1-2 micrometers may be achieved. The inventors have found that, in the low-temperature color filter technology, it is necessary to employ a low temperature curing process to bond the color filter layer and an encapsulating layer of the OLED device. However, the low temperature curing process may result in a poor bonding between the color filter layer and the encapsulating layer of the OLED device, so that a reliability of the OLED display on silicon may be adversely affected.

Some embodiments of the present disclosure provide an electroluminescent display panel on silicon. As shown in FIG. 1, the electroluminescent display panel on silicon includes: a silicon backplate 1, and a light emitting device 2, an electrode 3, an encapsulating layer 10, an adhesive layer 5 and a color filter layer 6 which are sequentially disposed on the silicon backplate 1. For example, the light emitting device 2 may be an OLED device.

In the embodiments of the present disclosure, the adhesive layer 5 is disposed between the color filter layer 6 and the encapsulating layer 10, for example, the adhesive layer 5 includes an adhesive to increase the adhesion between the color filter layer 6 and the encapsulating layers 10 of the OLED device, thereby improving the reliability of the electroluminescent display panel on silicon.

Figure 2:
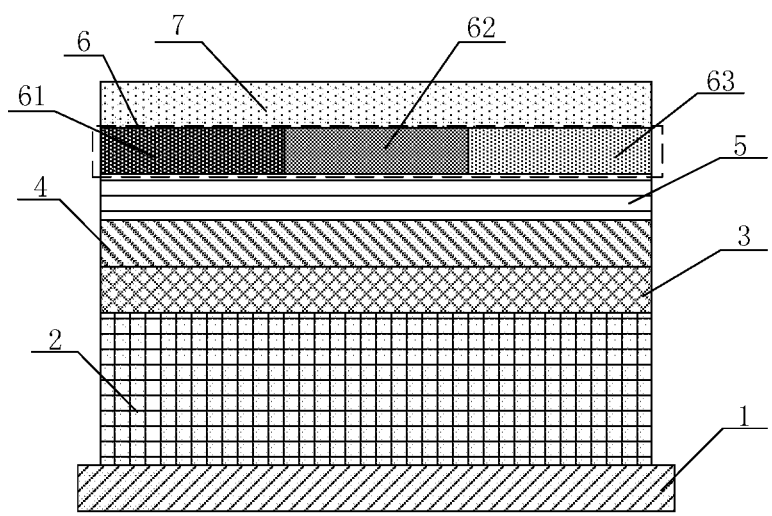
FIG. 2 is a schematic structural view of an electroluminescent display panel on silicon according to some embodiments of the present disclosure.

On this basis, some embodiments of the present disclosure further provide an electroluminescent display panel on silicon. As shown in FIG. 2, the electroluminescent display panel on silicon includes: a silicon backplate 1, and a light emitting device 2, an electrode 3, a first sealing layer 4, an adhesive layer 5, and a color filter layer 6 which are sequentially disposed on the silicon backplate 1. Specifically, the light emitting device 2 is disposed on the silicon backplate 1, the electrode 3 is disposed on a side of the light emitting device 2 away from the silicon backplate 1, the first sealing layer 4 is disposed on a side of the electrode 3 away from the light emitting device 2, the adhesive layer 5 is disposed on a side of the first sealing layer 4 away from the electrode 3, and the color filter layer 6 is disposed on a side of the adhesive layer 5 away from the first sealing layer 4. The adhesive layer 5 may include an adhesive which is disposed between the first sealing layer 4 and the color filter layer 6 to increase the adhesion between the first sealing layer 4 and the color filter layer 6.

The light emitting device 2 includes a luminescent material. For example, the light emitting device 2 may be an OLED device which may include an organic luminescent material.

According to the embodiments of the present disclosure, the first sealing layer 4 includes an anti-ultraviolet light material for preventing ultraviolet light from irradiating onto the luminescent material. The inventors have found through research that in a process of manufacturing the above electroluminescent display panel on silicon, it is necessary to employ an ultraviolet curing process to cure the adhesive in order to form the adhesive layer. In the electroluminescent display panel on silicon according to the embodiments of the present disclosure, in a process of irradiating the adhesive with ultraviolet light, the anti-ultraviolet light material of the first sealing layer may prevent the ultraviolet light from irradiating onto the luminescent material of the light emitting device, thereby avoiding damage to the luminescent material. That is, it is possible to cure the adhesive without damaging the luminescent material, thus the reliability of the electroluminescent display panel on silicon may be improved.

Optionally, an orthographic projection of the first sealing layer 4 on the silicon backplate 1 covers an orthographic projection of the light emitting device 2 on the silicon backplate 1, so that the ultraviolet light may be completely prevented from irradiating onto the luminescent material of the light emitting device.

Figure 3A:
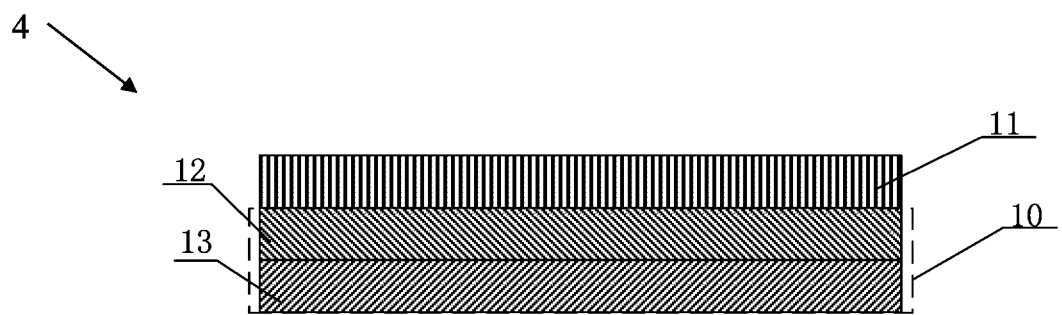
FIG. 3A~FIG. 3D are schematic structural views of a first sealing layer of an electroluminescent display panel on silicon according to some embodiments of the present disclosure.
Figure 3B:
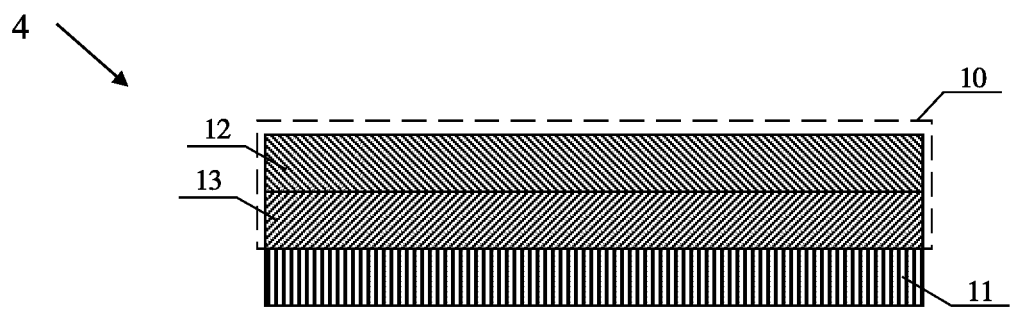
Figure 3C:
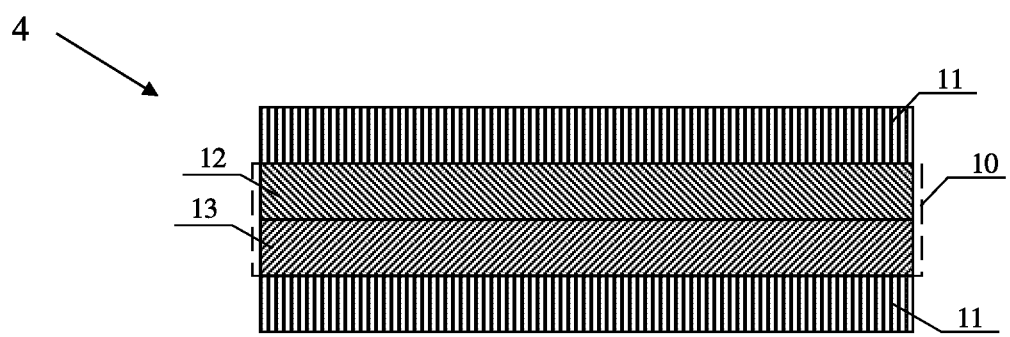

FIG. 3A to FIG. 3D are respectively schematic structural views of a sealing layer of an electroluminescent display panel on silicon according to the embodiments of the present disclosure. As shown, the first sealing layer 4 may include a light removing layer 11 and an encapsulating layer 10. The light removing layer 11 includes the anti-ultraviolet light material as described above. Referring to FIG. 2 and FIG. 3A, the light removing layer 11 may be disposed on a side of the encapsulating layer 10 proximate to the adhesive layer 5. Referring to FIG. 2 and FIG. 3B, the light removing layer 11 may be disposed on a side of the encapsulating layer 10 away from the adhesive layer 5. Referring to FIG. 2 and FIG. 3C, the first sealing layer 4 may include more than one light removing layers 11, and the light removing layers 11 may be respectively disposed on the side of the encapsulating layer 10 proximate to the adhesive layer 5 and on the side of the encapsulating layer 10 away from the adhesive layer 5.

For example, the encapsulating layer 10 may be a thin-film encapsulating layer (i.e., TFE). Specifically, as shown in FIG. 3A~FIG. 3C, the encapsulating layer 10 includes at least one organic encapsulating layer 13 and at least one inorganic encapsulating layer 12, and the organic encapsulating layer 13 and the inorganic encapsulating layer 12 are alternately disposed such that the encapsulating layer 10 has a laminated structure. It will be understood by those skilled in the art that the organic encapsulating layer is typically composed of an organic material suitable for encapsulation, and the inorganic encapsulating layer is typically composed of an inorganic material suitable for encapsulation.

Figure 3D:
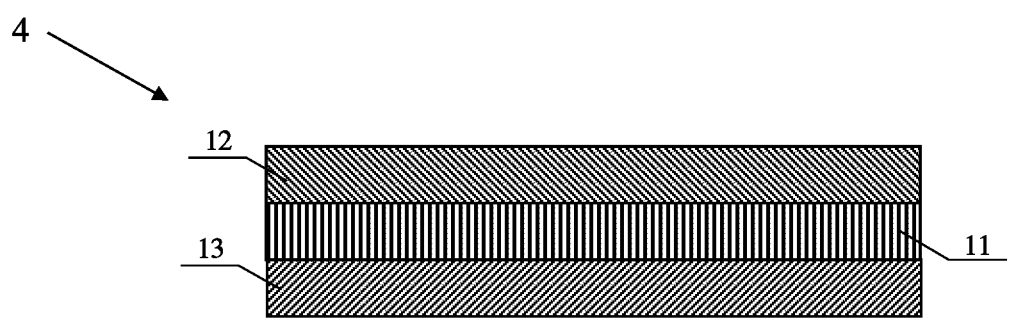

As shown in FIG. 3D, the light removing layer 11 may be disposed between any adjacent ones of the organic encapsulating layer 13 and the inorganic encapsulating layer 12. Of course, in other embodiments, a plurality of light removing layers 11 may be disposed. Besides that the light removing layer 11 is disposed between any adjacent ones of the organic encapsulating layer 13 and the inorganic encapsulating layer 12, other light removing layers 11 may be disposed on the side of the encapsulating layer 10 proximate to the adhesive layer 5 and/or on the side of the encapsulating layer 10 away from the adhesive layer 5.

Figure 4:
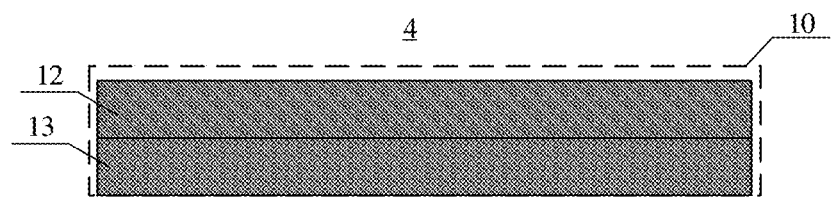
FIG. 4 is a schematic structural view of a first sealing layer of an electroluminescent display panel on silicon according to some embodiments of the present disclosure.

FIG. 4 is a schematic structural view of a sealing layer of an electroluminescent display panel on silicon according to the embodiments of the present disclosure. As shown in FIG. 4, the first sealing layer 4 may include only the encapsulating layer 10. The encapsulating layer 10 includes at least one organic encapsulating layer 13 and at least one inorganic encapsulating layer 12, and the organic encapsulating layer 13 and the inorganic encapsulating layer 12 are alternately disposed such that the encapsulating layer 10 has a laminated structure. It will be understood by those skilled in the art that the organic encapsulating layer is typically composed of an organic material suitable for encapsulation (herein also referred to as an organic encapsulating material), and the inorganic encapsulating layer is typically composed of an inorganic material suitable for encapsulation (herein also referred to as inorganic encapsulating material).

For example, at least one organic encapsulating layer 13 may include both the organic encapsulating material and the anti-ultraviolet light material. Alternatively, at least one inorganic encapsulating layer may include the inorganic encapsulating material and the anti-ultraviolet light material. That is, the first sealing layer 4 does not include a light removing layer 11 which is separately disposed, and the anti-ultraviolet light material may be doped in the organic encapsulating layer and/or doped in the inorganic encapsulating layer. In this way, the organic encapsulating layer doped with the anti-ultraviolet light material or the inorganic encapsulating layer doped with the anti-ultraviolet light material may simultaneously serve to encapsulate the light emitting device and prevent the ultraviolet light from irradiating onto the luminescent material.

Referring back to FIG. 2, the color filter layer 6 may include a red color filter layer 61, a green color filter layer 62, and a blue color filter layer 63. However, it will be understood by those skilled in the art that the color filter layer 6 may also include color filter layers of other colors and arrangement orders.

Optionally, the anti-ultraviolet light material may include an ultraviolet light converting material for converting ultraviolet light into visible light. In such a case, the light removing layer 11 includes the ultraviolet light converting material, so that it may be referred to as a light converting layer 11.

In the embodiments, the first sealing layer 4 includes the light converting layer 11 and the encapsulating layer 10. Referring to FIG. 2 and FIG. 3A, the light converting layer 11 may be disposed on the side of the encapsulating layer 10 proximate to the adhesive layer 5. Referring to FIG. 2 and FIG. 3B, the light converting layer 11 may be disposed on the side of the encapsulating layer 10 away from the adhesive layer 5. Referring to FIG. 2 and FIG. 3C, the first sealing layer 4 may include more than one light converting layers 11, and the light converting layers 11 may be respectively disposed on the side of the encapsulating layer 10 proximate to the adhesive layer 5 and on the side of the encapsulating layer 10 away from the adhesive layer 5.

For example, the encapsulating layer 10 may be a thin-film encapsulating layer (i.e., TFE). Specifically, as shown in FIG. 3A~FIG. 3C, the encapsulating layer 10 includes at least one organic encapsulating layer 13 and at least one inorganic encapsulating layer 12, and the organic encapsulating layer 13 and the inorganic encapsulating layer 12 are alternately disposed such that the encapsulating layer 10 has a laminated structure.

As shown in FIG. 3D, the light converting layer 11 may be disposed between any adjacent organic encapsulating layer 13 and inorganic encapsulating layer 12. Of course, in other embodiments, a plurality of light converting layers 11 may be disposed. Besides that the light converting layer 11 is disposed between any adjacent ones of the organic encapsulating layer 13 and the inorganic encapsulating layer 12, other light converting layers 11 may be disposed on the side of the encapsulating layer 10 proximate to the adhesive layer 5 and/or on the side of the encapsulating layer 10 away from the adhesive layer 5.

As shown in FIG. 4, the first sealing layer 4 may include only the encapsulating layer 10. The encapsulating layer 10 includes at least one organic encapsulating layer 13 and at least one inorganic encapsulating layer 12, and the organic encapsulating layer 13 and the inorganic encapsulating layer 12 are alternately disposed such that the encapsulating layer 10 has a laminated structure.

For example, at least one organic encapsulating layer 13 includes both the organic encapsulating material and the ultraviolet light converting material. The ultraviolet light converting material may be doped in the organic encapsulating layer. Thus, the organic encapsulating layer doped with the ultraviolet light converting material may simultaneously serve to encapsulate the light emitting device and prevent ultraviolet light from irradiating onto the luminescent material.

Alternatively, the ultraviolet light converting material may include europium-4,7-phenyl-1,10-phenanthroline complex.

For example, a weight percentage of the europium-4,7-phenyl-1,10-phenanthroline complex in the light converting layer 11 may be set in proportion to a thickness of the light converting layer 11, that is, the weight percentage of the europium-4,7-phenyl-1,10-phenanthroline complex in the light converting layer 11 may be increased as the thickness of the light converting layer 11 is increased. In some embodiments, the thickness of the light converting layer 11 may in a range of 1 to 10 μm. However, other suitable thicknesses may be used by those skilled in the art according to actual needs, and the embodiment of the present disclosure does not particularly limit the thickness of the light converting layer 11.

For example, the europium-4,7-phenyl-1,10-phenanthroline complex may be doped in the organic encapsulating material such that the organic encapsulating layer also functions as the light converting layer.

For example, the method for preparing the ultraviolet light converting material may include: dissolving 4,7-diphenyl-1,10-phenanthroline and europium nitrate hexahydrate in ethanol; forming a precipitate (i.e., europium-4,7-phenyl-1,10-phenanthroline complex) through uniform stir; rinsing the precipitate with absolute ethanol, and drying the precipitate; and dispersing the dried precipitate in a PVP ethanol solution, wherein a weight percentage of the precipitate in the PVP ethanol solution is in a range of 0.5% to 1.5%.

As used herein, "PVP ethanol solution" refers to a solution containing PVP and ethanol. "PVP" is an abbreviation for povidone which is used to increase the dispersibility and film formability of the europium-4,7-phenyl-1,10-phenanthroline complex in the solution. For example, a weight percentage of PVP in the PVP ethanol solution may be about 5%.

Figure 5:
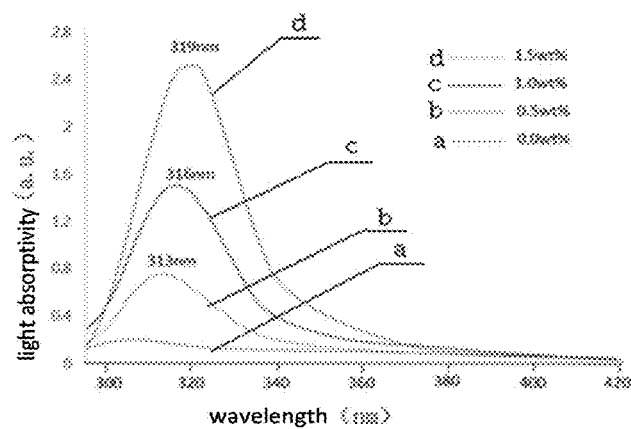
FIG. 5 are absorption spectrum diagrams of a first sealing layer, having different weight percentages of light converting material, of an electroluminescent display panel on silicon according to some embodiments of the present disclosure, respectively.

FIG. 5 illustrates absorption spectrums which show absorption of ultraviolet light by the ultraviolet light converting material in the first sealing layer according to the embodiments of the present disclosure. As shown in FIG. 5, curve "a" represents an absorption spectrum in a case that the weight percentage of the precipitate (i.e., europium-4, 7-phenyl-1,10-phenanthroline complex) in the PVP ethanol solution is 0.0 wt %; curve "b" represents an absorption spectrum in a case that the weight percentage of the precipitate (i.e., europium-4,7-phenyl-1,10-phenanthroline complex) in the PVP ethanol solution is 0.5 wt %; curve "c" represents an absorption spectrum in a case that the weight percentage of the precipitate (i.e., europium-4,7-phenyl-1, 10-phenanthroline complex) in the PVP ethanol solution is 1.0 wt %; and curve "d" represents an absorption spectrum in a case that the weight percentage of the precipitate (i.e., europium-4,7-phenyl-1,10-phenanthroline complex) in the PVP ethanol solution is 1.5 wt %. From these spectrum curves, it can be seen that the light converting layer containing the europium-4,7-phenyl-1,10-phenanthroline complex exhibits a broad and strong absorption band within the ultraviolet range, so that it has high adsorption in the ultraviolet range and is capable of converting ultraviolet light into visible light. Moreover, absorption of ultraviolet light by the light converting layer is changed as a content of the europium-4,7-phenyl-1,10-phenanthroline complex is changed. Therefore, in the process of curing the adhesive layer with ultraviolet light, the first sealing layer containing the ultraviolet light converting material may spontaneously absorb the ultraviolet light and convert the ultraviolet light into visible light, thereby preventing the ultraviolet light from irradiating the light emitting device.

Figure 6:
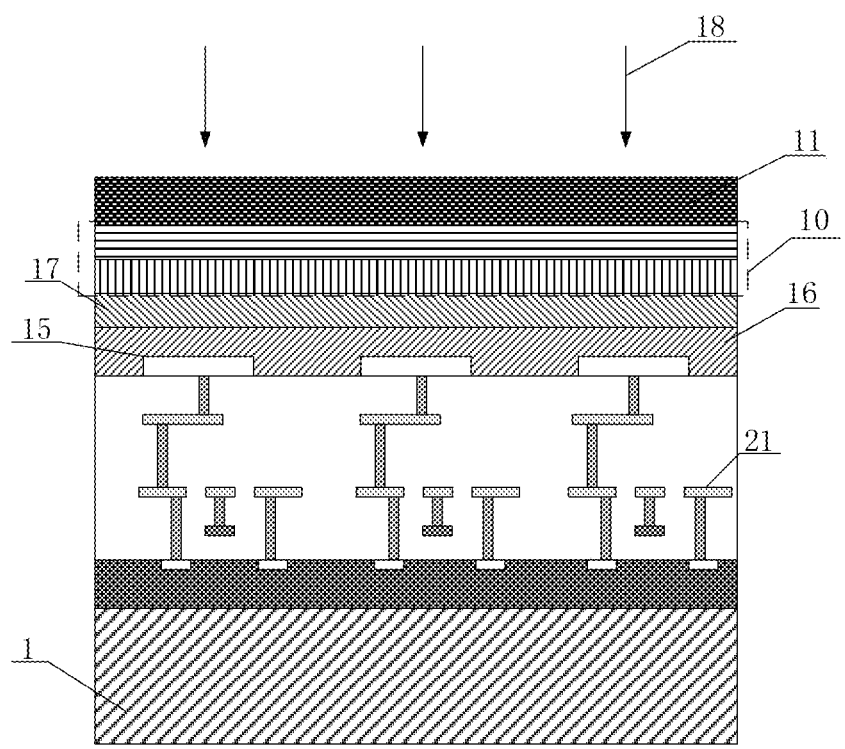
FIG. 6 is a schematic view showing a specific structure of an electroluminescent display panel on silicon according to some embodiments of the present disclosure.

FIG. 6 is a schematic view showing a specific structure of an electroluminescent display panel on silicon according to some embodiments of the present disclosure. As shown in FIG. 6, a complementary metal oxide semiconductor (CMOS) circuit 21, an anode 15, a light emitting layer 16, a cathode 17, an encapsulating layer 10, and a light converting layer 11 are sequentially disposed on the silicon backplate 1. When the ultraviolet light 18 irradiates onto the electroluminescent display panel on silicon, the light converting layer 11 is capable of converting the ultraviolet light into visible light, thereby reducing or avoiding damage to the light emitting layer 16 by the ultraviolet light irradiating process.

Optionally, the anti-ultraviolet light material may include an ultraviolet light filtering material for causing ultraviolet light to be cut off and allowing visible light to pass therethrough. In such a case, the light removing layer 11 includes an ultraviolet light filtering material, so that it may be referred to as a light filtering layer 11.

In the embodiments, the first sealing layer 4 includes a light filtering layer 11 and an encapsulating layer 10. Referring to FIG. 2 and FIG. 3A, the light filtering layer 11 may be disposed on the side of the encapsulating layer 10 proximate to the adhesive layer 5. Referring to FIG. 2 and FIG. 3B, the light filtering layer 11 may be disposed on the side of the encapsulating layer 10 away from the adhesive layer 5. Referring to FIG. 2 and FIG. 3C, the first sealing layer 4 may include more than one light filtering layers 11, and the light filtering layers 11 may be respectively disposed on the side of the encapsulating layer 10 proximate to the adhesive layer 5 and on the side of the encapsulating layer 10 away from the adhesive layer 5.

For example, the encapsulating layer 10 may be a thin-film encapsulating layer (i.e., TFE). Specifically, as shown in FIG. 3A~FIG. 3C, the encapsulating layer 10 includes at least one organic encapsulating layer 13 and at least one inorganic encapsulating layer 12, and the organic encapsulating layer 13 and the inorganic encapsulating layer 12 are alternately disposed such that the encapsulating layer 10 has a laminated structure.

As shown in FIG. 3D, the light filtering layer 11 may be disposed between any adjacent ones of the organic encapsulating layer 13 and the inorganic encapsulating layer 12. Of course, in other embodiments, a plurality of light filtering layers 11 may be disposed. Besides that the light filtering layer 11 is disposed between any adjacent organic encapsulating layer 13 and inorganic encapsulating layer 12, other light filtering layers 11 may be disposed on the side of the encapsulating layer 10 proximate to the adhesive layer 5 and/or on the side of the encapsulating layer 10 away from the adhesive layer 5.

As shown in FIG. 4, the first sealing layer 4 may include only the encapsulating layer 10. The encapsulating layer 10 includes at least one organic encapsulating layer 13 and at least one inorganic encapsulating layer 12, and the organic encapsulating layer 13 and the inorganic encapsulating layer 12 are alternately disposed such that the encapsulating layer 10 has a laminated structure.

For example, at least one inorganic encapsulating layer 12 includes both the inorganic encapsulating material and the ultraviolet light filtering material. The ultraviolet light filtering material may be doped in the inorganic encapsulating layer. Thus, the inorganic encapsulating layer doped with the ultraviolet light filtering material may simultaneously serve to encapsulate the light emitting device and prevent ultraviolet light from irradiating onto the luminescent material.

Optionally, the ultraviolet light filtering material may include cerium oxide ($CeO_2$) or titanium oxide ($TiO_2$).

Figure 7:
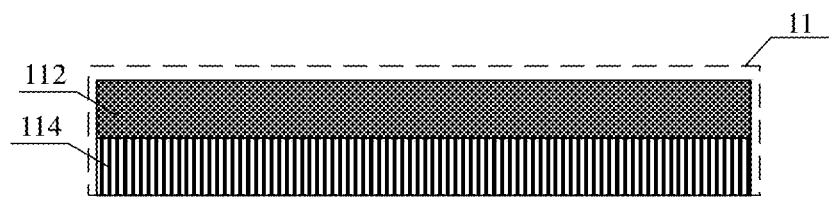
FIG. 7 is a schematic structural view of a light filtering layer of an electroluminescent display panel on silicon according to some embodiments of the present disclosure.

Optionally, the light filtering layer 11 includes at least one first light filtering sub-layer 112 and at least one second light filtering sub-layer 114, as shown in FIG. 7. The first light filtering sub-layer 112 and the second light filtering sub-layer 114 are alternately arranged such that the light filtering layer has a laminated structure. The first light filtering sub-layer 112 includes an ultraviolet light filtering material which is one of cerium oxide or titanium oxide, and the second light filtering sub-layer 114 includes an ultraviolet light filtering material which is the other one of cerium oxide or titanium oxide.

In the embodiments of the present disclosure, the light filtering layer 11 may have a single-layer structure or multi-layered structure, and a thickness of the light filtering layer 11 may be set according to light exiting requirements, actual absorption requirements of ultraviolet light, and the like. The light filtering layer 11 has a high absorptivity in the ultraviolet band and a low absorptivity in the visible light band, that is, it allows visible light to pass through. Therefore, during curing the adhesive layer with the ultraviolet light, the first sealing layer containing the ultraviolet light filtering material may block the ultraviolet light, thereby preventing the ultraviolet light from irradiating onto the light emitting device; during a display process, the first sealing layer containing the ultraviolet light filtering material does not block the visible light from exiting, so that it does not affect the display function.

In the case where the filter layer has the laminated structure, the absorption of the ultraviolet light by the light filtering layer 11 is related to a period x and an overall thickness of the light filtering layer 11. The period x refers to the number of laminations, composed of the first light filtering sub-layer 112 and the second light filtering sub-layer 114, of the light filtering layer 11. When x is equal to 1, the light filtering layer 11 includes only one lamination, that is, only one first light filtering sub-layer 112 and only one second light filtering sub-layer 114; when x is equal to 2, the light filtering layer 11 includes two laminations, that is, two first light filtering sub-layers 112 and two second light filtering sub-layers 114; when x is equal to 3, the light filtering layer 11 includes three laminations, that is, three first light filtering sub-layers 112 and three second light filtering sub-layer 114, and so on. As the overall thickness of the light filtering layer 11 is increased, a cut-off ratio of the ultraviolet light is increased, but a transmittance of the visible light is also lowered to some extent. In a specific implementation, the overall thickness of the light filtering layer 11 may be selected to be 127 nm. With the light filtering layer 11 having such a thickness, the transmittance of the visible light exceeds 85%, and the cut-off ratio of the ultraviolet light reaches 80%. In practical applications, the structure and the thickness of the light filtering layer 11 may be adjusted according to requirements on the ultraviolet light cut-off combined with requirements on the thickness of the inorganic encapsulating layer in an encapsulating technology. Since a plurality of laminations may cause a complicated preparing process, one period may be selected, and the absorption of ultraviolet light may be adjusted by adjusting the overall thickness of the light filtering layer 11. When the thickness of the light filtering layer 11 reaches 550 nm, the cut-off ratio of the ultraviolet light in such a case may reach 99% or more.

Referring back to FIG. 6, a complementary metal oxide semiconductor circuit 21, an anode 15, a light emitting layer 16, a cathode 17, an encapsulating layer 10, and a light filtering layer 11 are sequentially disposed on the silicon backplate 1. When the ultraviolet light 18 irradiates onto the electroluminescent display panel on silicon, the light filtering layer 11 may cut off the ultraviolet light 18, thereby reducing damage on the organic light emitting layer 16 by the ultraviolet light irradiating process. When the display panel is in operation, the light filtering layer 11 may allow the visible light to pass through, so that a display function is not affected.

Referring back to FIG. 2, the electroluminescent display panel on silicon further includes a second sealing layer 7 on a side of the color filter layer 6 away from the adhesive layer 5. A material of the second sealing layer 7 may include inorganic encapsulating materials such as silicon nitride, silicon oxide, aluminum oxide and the like. In this way, the light emitting device 2 and the color filter layer 6 may be further protected.

Some embodiments of the present disclosure further provide a display apparatus including the electroluminescent display panel on silicon according to any of the above embodiments. For example, the display apparatus may be any product or component having a display function, such as a smart phone, a wearable smart watch, smart glasses, a tablet, a television, a display, a digital photo frame, a navigator, an in-vehicle display, an e-book, and the like. It should be understood that beneficial effects of the display apparatus are identical to those of the above-mentioned electroluminescent display panels on silicon, and the detailed description thereof will not be repeated here.

Figure 8:
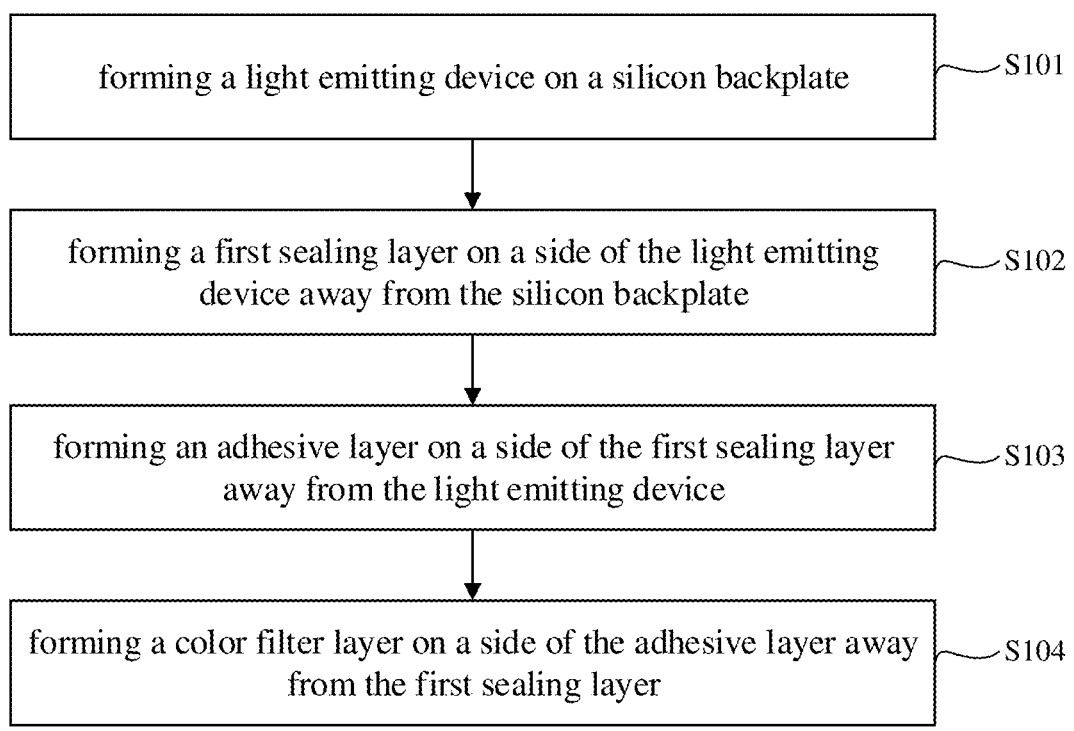
FIG. 8 is a flowchart of a method for manufacturing an electroluminescent display panel on silicon according to some embodiments of the present disclosure.

As shown in FIG. 8, a method for manufacturing an electroluminescent display panel on silicon according to some embodiments of the present disclosure may include the following steps:

S101: forming a light emitting device on a silicon backplate;

S102: forming a first sealing layer on a side of the light emitting device away from the silicon backplate;

S103: forming an adhesive layer on a side of the first sealing layer away from the light emitting device; and S104: forming a color filter layer on a side of the adhesive layer away from the first sealing layer.

For example, the light emitting device includes a luminescent material, and the first sealing layer includes an anti-ultraviolet light material for preventing ultraviolet light from irradiating onto the luminescent material. Specifically, the anti-ultraviolet light material includes an ultraviolet light converting material for converting ultraviolet light into visible light; or the anti-ultraviolet light material includes an ultraviolet light filtering material for causing ultraviolet light to be cut off and allowing visible light to pass through.

Optionally, the method may further include: forming an electrode on the silicon backplate, specifically, forming the electrode on the side of the light emitting device away from the silicon backplate.

Specifically, the specific processes for forming the light emitting device and the electrode on the silicon backplate may refer to the processes in the related art, and details are not described herein again.

For example, the step S103 may specifically include: applying an adhesive on the side of the first sealing layer away from the light emitting device, and then curing the adhesive by an ultraviolet curing process to form the adhesive layer.

For example, specific processes for forming the color filter layer may refer to the manufacturing processes in the related art, and details are not described herein again.

For example, the step S102 may specifically include: preparing an ultraviolet light converting material.

Specifically, the step of preparing the ultraviolet light converting material may include: dissolving 4,7-diphenyl-1,10-phenanthroline and europium nitrate hexahydrate in ethanol; forming a precipitate (i.e., europium-4,7-phenyl-1,10-phenanthroline complex) through uniform stir; rinsing the precipitate with absolute ethanol, and drying the precipitate; and dispersing the dried precipitate in a PVP ethanol solution, wherein a weight percentage of the precipitate in the PVP ethanol solution is in a range of 0.5% to 1.5%.

For example, the ultraviolet light converting material prepared by the above steps is coated on a surface of the encapsulating layer away from the silicon backplate to form the light converting layer; or the ultraviolet light converting material prepared by the above steps is doped in the organic encapsulating material to form an encapsulating layer having a light converting function.

For example, the step S102 may specifically include: preparing a filter layer.

Specifically, the step of preparing the filter layer may include: forming a filter layer containing cerium oxide ($CeO_2$) or titanium oxide ($TiO_2$) on a side of the encapsulating layer away from the silicon backplate; or alternately forming a light filtering sub-layer containing cerium oxide ($CeO_2$) and a light filtering sub-layer containing titanium oxide ($TiO_2$) on a side of the encapsulating layer away from the silicon backplate.

In the above manufacturing methods, the anti-ultraviolet light material in the first sealing layer may prevent the ultraviolet light from irradiating onto the luminescent material of the light emitting device, so that the luminescent material may be prevented from being damaged. That is, it is possible to cure the adhesive without damaging the luminescent material, so that the reliability of the electroluminescent display panel on silicon may be improved. It should be understood that the other beneficial effects brought by the manufacturing methods are identical to those of the above-mentioned electroluminescent display panel on silicon, and the detailed description thereof will not be repeated here.

While some embodiments according to a general inventive concept of the present disclosure have been shown and described, it will be understood by those skilled in the art that changes, modifications and variations may be made to these embodiments. The scope of the present disclosure shall be defined by the claims and equivalents thereof.

What is claimed is:

1. An electroluminescent display panel, comprising:
   a silicon backplate;
   a light emitting device on the silicon backplate;
   a first sealing layer on a side of the light emitting device away from the silicon backplate;
   an adhesive layer on a side of the first sealing layer away from the light emitting device; and
   a color filter layer on a side of the adhesive layer away from the first sealing layer,
   wherein the light emitting device comprises a luminescent material, and the first sealing layer comprises an anti-ultraviolet light material for preventing ultraviolet light from irradiating onto the luminescent material;
   wherein the anti-ultraviolet light material comprises an ultraviolet light converting material for converting the ultraviolet light into visible light; and
   wherein the first sealing layer comprises:
      at least one light converting layer, the at least one light converting layer comprising the ultraviolet light converting material; and
      an encapsulating layer comprising at least one organic encapsulating layer and at least one inorganic encapsulating layer, the at least one organic encapsulating layer and the at least one inorganic encapsulating layer being alternately disposed such that the encapsulating layer has a laminated structure, and
      wherein the at least one light converting layer is disposed between any adjacent ones of the at least one organic encapsulating layer and the at least one inorganic encapsulating layer.

2. The electroluminescent display panel of claim 1, wherein the ultraviolet light converting material comprises: europium-4,7-phenyl-1,10-phenanthroline complex.

3. The electroluminescent display panel of claim 2, wherein a weight percentage of the europium-4,7-phenyl-1,10-phenanthroline complex in the light converting layer is proportional to a thickness of the light converting layer.

4. The electroluminescent display panel of claim 1, wherein an orthographic projection of the first sealing layer on the silicon backplate covers an orthographic projection of the light emitting device on the silicon backplate.

5. The electroluminescent display panel of claim 1, wherein the adhesive layer comprises an adhesive that is curable under an irradiation of the ultraviolet light.

6. The electroluminescent display panel of claim 1, further comprising a second sealing layer on a side of the color filter layer away from the adhesive layer, wherein the second sealing layer comprises an inorganic encapsulating material.

7. A display apparatus comprising the electroluminescent display panel of claim 1.

8. An electroluminescent display panel, comprising:
   a silicon backplate;
   a light emitting device on the silicon backplate;
   a first sealing layer on a side of the light emitting device away from the silicon backplate;
   an adhesive layer on a side of the first sealing layer away from the light emitting device; and
   a color filter layer on a side of the adhesive layer away from the first sealing layer,
   wherein the light emitting device comprises a luminescent material, and the first sealing layer comprises an anti-ultraviolet light material for preventing ultraviolet light from irradiating onto the luminescent material;
   wherein the anti-ultraviolet light material comprises an ultraviolet light converting material for converting the ultraviolet light into visible light;
   wherein the first sealing layer comprises only an encapsulating layer, the encapsulating layer comprises at least one organic encapsulating layer and at least one inorganic encapsulating layer, the at least one organic encapsulating layer and the at least one inorganic encapsulating layer being alternately disposed such that the encapsulating layer has a laminated structure, and
   wherein the at least one organic encapsulating layer comprises an organic encapsulating material and the ultraviolet light converting material.

9. A method for manufacturing an electroluminescent display panel, comprising:
   forming a light emitting device on a silicon backplate;
   forming a first sealing layer on a side of the light emitting device away from the silicon backplate;
   forming an adhesive layer on a side of the first sealing layer away from the light emitting device; and
   forming a color filter layer on a side of the adhesive layer away from the first sealing layer,
   wherein the light emitting device comprises a luminescent material, and the first sealing layer comprises an anti-ultraviolet light material for preventing ultraviolet light from irradiating onto the luminescent material;
   wherein the anti-ultraviolet light material comprises an ultraviolet light converting material for converting the ultraviolet light into visible light; and
   wherein the first sealing layer comprises:
      at least one light converting layer, the at least one light converting layer comprising the ultraviolet light converting material; and
      an encapsulating layer comprising at least one organic encapsulating layer and at least one inorganic encapsulating layer, the at least one organic encapsulating layer and the at least one inorganic encapsulating layer being alternately disposed such that the encapsulating layer has a laminated structure,
      wherein the at least one light converting layer is disposed between any adjacent ones of the at least one organic encapsulating layer and the at least one inorganic encapsulating layer.

10. The method of claim 9, further comprising:
    preparing the ultraviolet light converting material, wherein the preparing the ultraviolet light converting material comprises:
    dissolving 4,7-diphenyl-1,10-phenanthroline and europium nitrate hexahydrate in ethanol;
    forming a precipitate through uniform stir;
    rinsing the precipitate with absolute ethanol, and drying the precipitate; and
    dispersing the dried precipitate in a PVP ethanol solution, wherein a weight percentage of the precipitate in the PVP ethanol solution is in a range of 0.5% to 1.5%.

* * * * *